Figure 1:
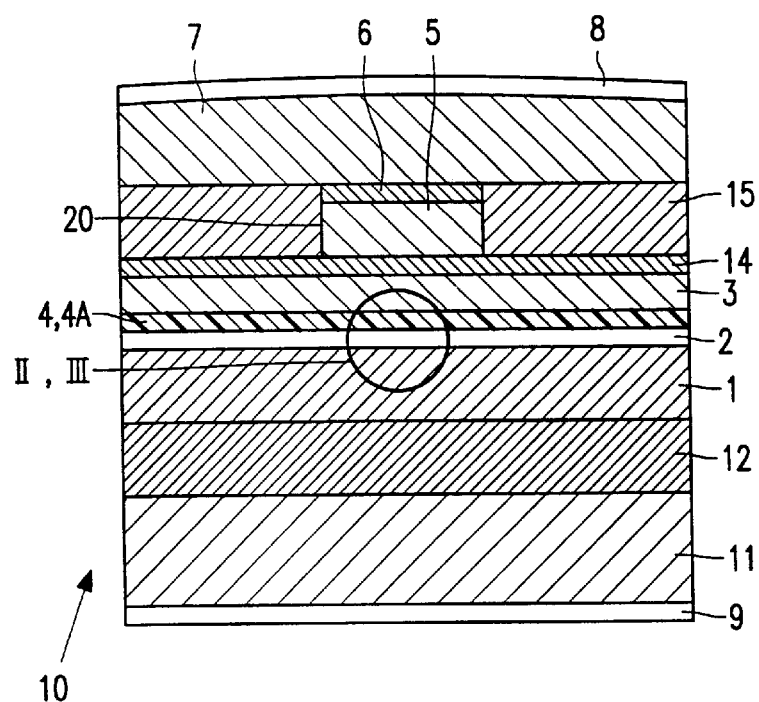

United States Patent [19]
Valster et al.

[11] Patent Number: 5,987,047
[45] Date of Patent: Nov. 16, 1999

[54] RADIATION-EMITTING SEMICONDUCTOR DIODE AND METHOD OF MANUFACTURING

[75] Inventors: Adriaan Valster; Arnoud Brouwer, both of Eindhoven, Netherlands

[73] Assignee: Uniphase Opto Holdings, Inc., San Jose, Calif.

[21] Appl. No.: 08/844,912

[22] Filed: Apr. 22, 1997

[30] Foreign Application Priority Data

Apr. 24, 1996 [EP] European Pat. Off. .............. 96201102

[51] Int. Cl.[6] ....................................................... H01S 3/19
[52] U.S. Cl. ................................................ 372/45; 372/46
[58] Field of Search ................... 372/43, 45, 46; 437/129

[56] References Cited

U.S. PATENT DOCUMENTS

| | | | |
|---|---|---|---|
| 5,274,656 | 12/1993 | Yoshida | 372/45 |
| 5,358,897 | 10/1994 | Valster | 372/43 |
| 5,496,767 | 3/1996 | Yoshida | 437/129 |
| 5,764,668 | 6/1998 | Ishizaka et al. | 372/45 |

FOREIGN PATENT DOCUMENTS

| | | | |
|---|---|---|---|
| 0540799A1 | 5/1993 | European Pat. Off. | H01L 33/00 |
| 62-137893 | 6/1987 | Japan | 372/46 |

*Primary Examiner*—Rodney Bovernick
*Assistant Examiner*—Yisun Song
*Attorney, Agent, or Firm*—Michael A. Glenn

[57] ABSTRACT

A radiation-emitting semiconductor diode in the InGaP/InAlGaP material system having a barrier for charge carriers situated between the active layer and one of the cladding layers. Such a diode has an emission wavelength between 0.6 and 0.7 μm and is particularly suitable, when constructed as a diode laser, for serving as a radiation source in, for example, a system for reading and/or writing of optical discs, also because of an increased efficiency. The diode includes a barrier layer comprising only a single barrier layer of AlP, which can be manufactured with a good reproducibility and high yield. A thin AlP barrier layer, having a thickness less than 5 nm, for example 2.5 nm, still provides an excellent barrier.

6 Claims, 3 Drawing Sheets

RADIATION-EMITTING SEMICONDUCTOR DIODE AND METHOD OF MANUFACTURING

The invention relates to a radiation-emitting semiconductor diode, in particular a semiconductor diode laser which will be called mostly diode hereinafter for short, with a semiconductor body comprising a substrate of a first conductivity type and preferably made of GaAs and with a semiconductor layer structure situated thereon and comprising at least a first cladding layer of the first conductivity type and made of InAlGaP or InAlP, a second cladding layer of a second conductivity type opposed to the first and also made of InAlGaP or InAlP, and between the first and second cladding layers an active layer of InGaP or InAlGaP and a pn junction which, given a sufficient current strength in the forward direction, is capable of generating electromagnetic radiation through recombination of charge carriers in a strip-shaped active region forming part of the active layer, the first and the second cladding layer being connected to connection conductors, while a barrier for the charge carriers is present between the active layer and the first or second cladding layer, which barrier has a greater bandgap than the first or second cladding layer. The invention also relates to a method of manufacturing such a diode.

Such a diode emits between 0.6 and 0.7 μm and is suitable as a laser inter alia for use as a radiation source in a system for optical discs which can be read and/or written, in a laser printer, or a bar code reader.

Such a diode is known from U.S. Pat. No. 5,274,656 published Dec. 18, 1993. The diode known from this document comprises a barrier for charge carriers formed by an InAlGaP or InAlP layer situated between the active layer and a cladding layer. In addition, according to the cited document, the barrier may comprise a MQB (=Multi Quantum Barrier) layer structure with alternating quantum well layers and barrier layers. A possible thickness for the charge carrier barrier is indicated as lying between 5 and 10 nm. The barrier is such that the (radiation) beam of the diode reaches from the active layer through the barrier into the cladding layer. The combination of such a barrier having a great bandgap with a cladding layer having a small bandgap has the following purposes: on the one hand a good confinement of the charge carriers in the active layer owing to the great bandgap of the barrier, which gives the diode a high (external) efficiency, and on the other hand the possibility of giving the cladding layer a low resistance by means of a high doping level, thanks to the small bandgap of this cladding layer. The series resistance of the diode is low as a result.

A disadvantage of the known diode is that it often shows no or at least an insufficient improvement of the efficiency compared with diodes without barriers. An additional disadvantage of the known diode is that it is comparatively difficult to manufacture because the compositions and thicknesses of the layers forming the barrier are difficult to control. If as a result of this the height and/or the thickness of the barrier becomes too small, it will be insufficiently effective, and the diode will be useless. However, if the height and/or thickness of the barrier becomes too great, inadmissible stresses will arise in the barrier and the diode will have too short a life.

It is an object of the present invention to provide a diode which on the one hand has a very high efficiency and on the other hand is easy to manufacture, while the yield of useful, long-life diodes is high.

According to the invention, a radiation-emitting semiconductor diode of the kind mentioned in the opening paragraph is for this purpose characterized in that the barrier is formed by only a single barrier layer comprising AlP. The invention is based on the one hand on the surprising recognition that a MQB barrier will only function satisfactorily when the charge carriers leaking away from the active layers have a sufficient coherence, and that this is not or at least substantially not the case in practice, and on the other hand on the surprising experimental result that a single, very thin barrier layer of AlP forms an excellent barrier. The diode according to the invention has a surprisingly high efficiency which may be up to 30% higher than that of a diode without barrier. A diode according to the invention is also very easy to manufacture because only a single III element and a single V element need be provided for growing a single AlP layer during the deposition process for the barrier layer. In other words, the problem of controlling the composition of the barrier is nonexistent in a diode according to the invention. The yield of useful diodes is extremely high as a result of this.

In a preferred embodiment of a diode according to the invention, the AlP barrier layer has a thickness smaller than 5 nm. The stresses generated in the diode according to the invention by such a barrier are found to be admissible in spite of the very small distance from the barrier to the active layer. It was indeed found experimentally that a diode according to the invention has a surprisingly long life. The excellent effectivity of a barrier having such a small thickness, for example a thickness of approximately 2.5 nm, is also very surprising because it is generally assumed that a barrier must have a thickness greater than 10 nm in the case of electrons and greater than 5 nm in the case of holes for preventing the relevant charge carriers from tunneling through the barrier, cf. for example EPA 0,540,799 published Dec. 5, 1993, especially p. 7, 11. 1–16.

Although a barrier may be present on both sides of the active layer, which barriers will then each comprise only a single barrier layer according to the invention, a diode according to the invention preferably comprises a barrier of a single barrier layer only between the active layer and that cladding layer which is of the p-conductivity type. It was found that an additional barrier between the active layer and the n-type cladding layer substantially does not contribute to an increase in the efficiency. To minimize the tension in the diode, and thus to increase its life, the latter barrier is preferably omitted.

In a very favorable modification, the barrier layer is present within a distance from the active layer which is equal to the diffusion length of the charge carrier. The barrier will be effective when this is the case. This means, for example, that a barrier layer present between the active layer and the p-type cladding layer should be at a distance of less than 40 nm from the active layer. Preferably, the barrier layer lies at the interface between the active layer and a cladding layer. It is also possible, however, for the barrier layer to lie (just) within a cladding layer or separate confinement layer.

Preferably, the active layer of a diode according to the invention has a multi quantum well structure of alternating quantum well layers of GaInP or InAlGaP and further barrier layers of InAlGaP. The multiquantum well structure may also be surrounded by further barrier layers of InAlGaP, but is preferably surrounded by separate confinement layers of InAlGaP. In that case the starting current of a diode according to the invention is a minimum, so that it is highly suitable for applications where a high output power of the diode is desired. For the same reason the quantum well layers are preferably given a mechanical stress caused by a lattice constant different from that of the substrate. A tensional stress in the quantum well layers makes the emission wavelength of the diode lower. Not only a high power, but also a wavelength which is as small as possible is necessary for the application mentioned above of a radiation source in a system of optical discs which can be read and/or written. A small wavelength allows of a system with a high information density. Particularly favorable results are obtained with a diode whose active layer comprises two quantum well layers of InGaP which are separated by a further barrier layer of InAlGaP and surrounded by separate confinement layers of InAlGaP.

A method according to the invention, whereby a semiconductor layer structure is provided on a GaAs substrate of a first conductivity type, with at least a first cladding layer of the first conductivity type and made of InAlGaP or InAlP, an active layer of InGaP or InAlGaP, and a second cladding layer of a second conductivity type opposed to the first and made of InAlGaP or InAlP, whereby the first and second cladding layers are provided with connection conductors, and whereby a barrier for charge carriers with a greater bandgap than the first or second cladding layer is formed between the active layer and the first or second cladding layer, according to the invention is characterized in that the barrier is formed by a single barrier layer of AlP. A diode according to the invention is obtained in a simple manner by such a method. In a preferred embodiment of a method according to the invention, a thickness smaller than 5 nm is chosen as the thickness of the AlP barrier layer.

Figure 2:
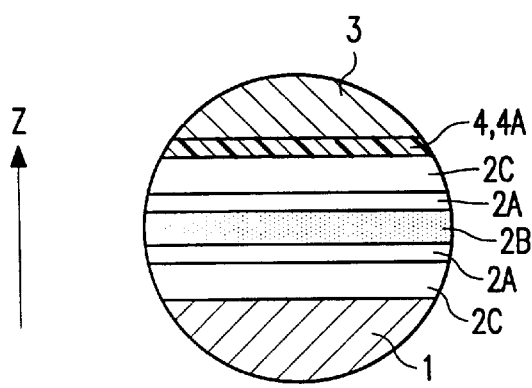
Figure 3:
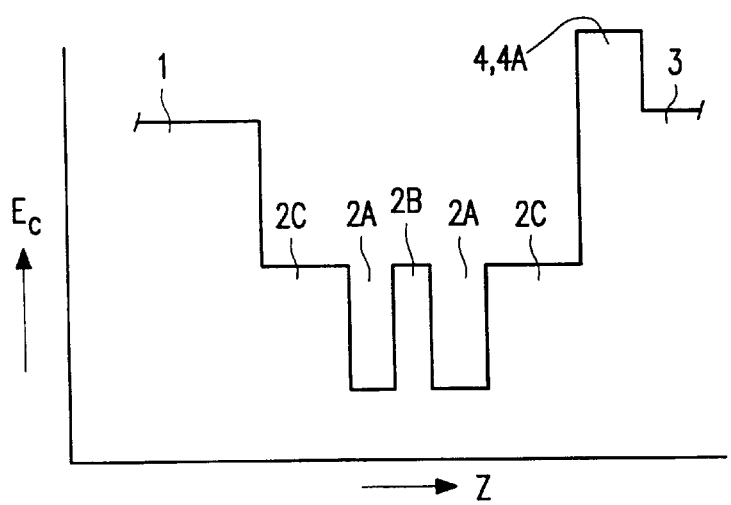
Figure 5:
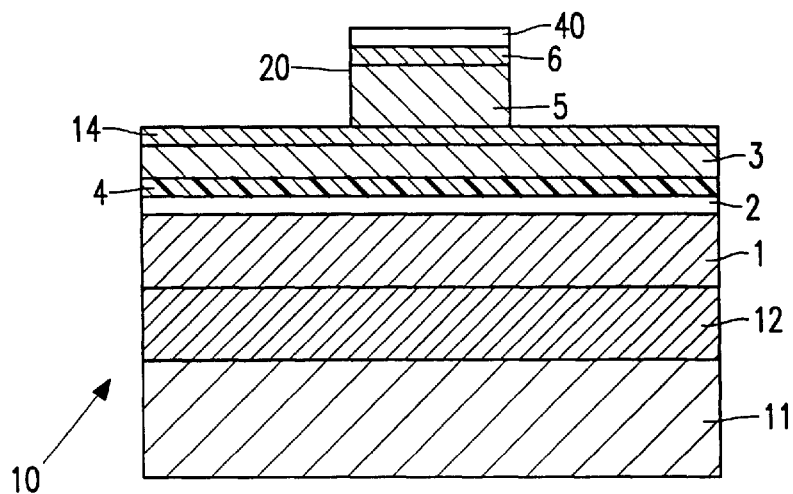
Figure 6:
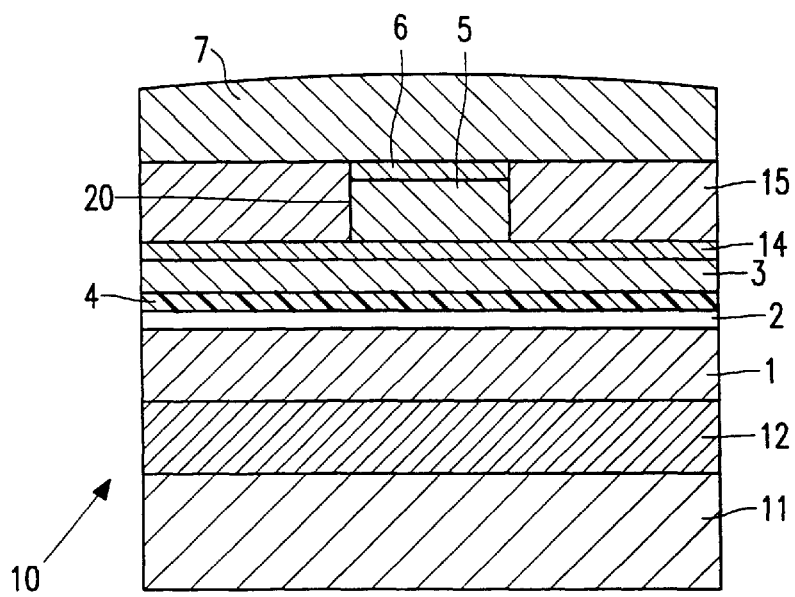
Figure 7:
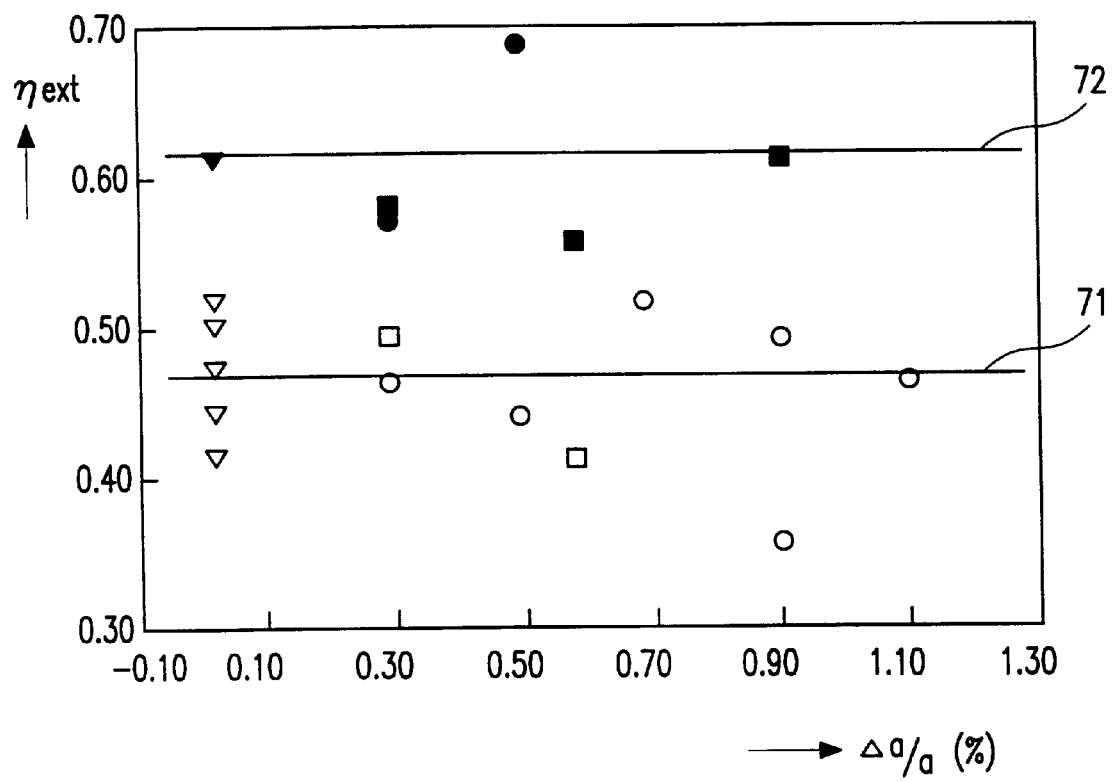

The invention will now be explained in more detail with reference to an embodiment and the accompanying drawing, in which FIG. 1 shows a radiation-emitting semiconductor diode according to the invention in a diagrammatic cross-section perpendicular to the longitudinal direction of the resonance cavity, FIG. 2 diagrammatically shows the semiconductor layer structure adjacent the active layer of the diode of FIG. 1, FIG. 3 is a diagram plotting the conduction band gradient in the thickness direction (z) in the surroundings of the active layer of the diode of FIG. 1, FIGS. 4 to 6 diagrammatically show the diode of FIG. 1 in consecutive stages of its manufacture by a method according to the invention, and FIG. 7 represents the external efficiency ($\eta_{ext}$) of a number of diodes with and without AlP barrier layers comparable to the diode of FIG. 1.

The Figures are diagrammatic and not drawn true to scale, the dimensions in the thickness direction being particularly exaggerated for greater clarity. Corresponding parts have been given the same reference numerals in the various Figures as a rule.

FIG. 1 shows a first and a second embodiment of a diode according to the invention, here in the form of a diode laser, in a diagrammatic cross-section perpendicular to the longitudinal direction of the resonance cavity. The diode comprises a semiconductor body 10 with a substrate 11 of a first, here the n-conductivity type comprising monocrystalline GaAs in this example and provided with a connection conductor 9. A semiconductor layer structure is provided thereon, in this example comprising a buffer layer 12 of n-AlGaAs, a first cladding layer 1 of n-InAlGaP, an active layer 2 of InGaP and InAlGaP, a second cladding layer 3 of p-InAlGaP, a third cladding layer 5 also of p-InAlGaP, an intermediate layer 14 of InGaP, a transition layer 6 of InGaP, and a contact layer 7 of p-GaAs. A pn junction is present between the first cladding layer 1 and the second cladding layer 3. The intermediate layer 14 here serves inter alia as an etching stopper layer during the formation of the strip-shaped mesa 20 which comprises the third cladding layer 5 and the transition layer 6. On either side of the mesa 20 and between the intermediate layer 14 and the contact layer 7 there is a current-blocking layer 15 of n-GaAs here. A strip-shaped active region arises below the mesa 20 in the active layer 2 during operation. Two end faces of the semiconductor body 10 bounding the strip-shaped active region and acting as mirror surfaces for a resonance cavity of the laser-type diode here lie parallel to the plane of drawing. The diode in this example is of the index-guided and BR (=Buried Ridge) type. The electrical connection of the pn junction situated between the first and the second cladding layer 1, 3 is effected through connection conductors 8, 9 on the contact layer 7 and the substrate 1, respectively.

FIGS. 2 and 3 diagrammatically show the semiconductor layer structure and the gradient of the conduction band in the thickness direction (z) in the surroundings of the active layer 2 of the diode of FIG. 1. The active layer 2 here comprises a multi quantum well structure with two quantum well layers 2A which are separated from one another by a further barrier layer 2B and are surrounded by two separate confinement layers 2C. Between the active layer 2 and the first or second cladding layer 1, 3, here the second cladding layer 3, there is a barrier 4A (see FIGS. 1 to 3) for charge carriers which has a greater bandgap than the relevant cladding layer 1, 3, so here than the second cladding layer 3.

According to the invention, the barrier 4A is formed by only a single barrier layer 4 made of AlP. In contrast to a MQB barrier, which only functions satisfactorily when the charge carriers from the active layer 2 are coherent, which is found to be not the case in practice, a barrier 4A comprising a single barrier layer 4 does operate excellently, provided it is made from AlP. Firstly, such a barrier layer 4 results in a major increase in the efficiency of the diode. Next, such a comparatively thin barrier layer 4 does not introduce too many stresses into the diode. The latter thus has a particularly long useful life. Since the growing of an AlP layer 4 involves no problems of controlling the composition of the layer 4, the diode according to the invention can be manufactured in a very reproducible manner and with a high yield. The cost price of the diode may thus be low, which is very important especially for the envisaged application.

The thickness of the barrier layer 4 is smaller than 5 nm and is preferably 2.5 nm, as in the present example. It is highly surprising that such a small thickness does not prevent the barrier layer 4 from functioning satisfactorily as a barrier 4A and even results in a major efficiency increase of the diode according to the invention of approximately 30%. The stresses introduced into the diode given this thickness of the barrier layer 4 are remarkably low. This manifests its itself inter alia in the very long life of the diode according to this embodiment, which is more than 4,000 hours at 50° C. with an optical power of 5 mW. This renders the diode according to the invention very suitable for the envisaged application. The barrier layer 4 in this example lies exactly at the interface between the active layer 2 and the second cladding layer 3. This means that the distance between the active layer 2 and the barrier layer 4 is smaller than 40 nm, and thus smaller than the diffusion length of electrons. The barrier layer 4 can function satisfactorily as the barrier 4A also as a result of this.

There is only one barrier 4A, comprising only a single barrier layer 4, between the active layer 2 and the p-type cladding layer 3, here the second cladding layer 3, in the present embodiment of the diode. It was found in practice that a barrier between the active layer 2 and the n-type cladding layer 1, so the first cladding layer 1, in the diode according to the invention substantially does not contribute to an increase in the efficiency of the diode. The use of only a single barrier 4A between the active layer 2 and the p-type cladding layer 3 leads to minimum stresses in the diode and also renders the manufacture of the diode particularly simple. The semiconductor materials and their compositions, thicknesses, doping levels, and the stress levels built into the various layers can be found in the Table below. A measure for the latter quantity is the relative difference in lattice constant between the relevant layer and the substrate ($\Delta a/a$).

| Layer | Semiconductor | Type | Conc. (at/cm$^3$) | d ($\mu$m) | $\Delta a/a$ (%) |
|---|---|---|---|---|---|
| 11 | GaAs | N | $2 \times 10^{18}$ | 350 | 0 |
| 12 | Al$_{0.20}$Ga$_{0.80}$As | N | $2 \times 10^{18}$ | 0.1 | 0 |
| 1 | In$_{0.50}$Al$_{0.35}$Ga$_{0.15}$P | N | $5 \times 10^{17}$ | 1.4 | 0 |
| 2A | In$_{0.62}$Ga$_{0.38}$P | — | — | 0.008 | +1.0 |
| 2B | In$_{0.42}$Al$_{0.23}$Ga$_{0.35}$P | — | — | 0.016 | −0.5 |
| 2C | In$_{0.50}$Al$_{0.20}$Ga$_{0.30}$P | — | — | 0.030 | 0 |
| 4 | AlP | — | — | 0.0025 | −3.5 |
| 3 | In$_{0.50}$Al$_{0.35}$Ga$_{0.15}$P | P | $3 \times 10^{17}$ | 0.3 | 0 |
| 5 | In$_{0.50}$Al$_{0.35}$Ga$_{0.15}$P | P | $3 \times 10^{17}$ | 1.1 | 0 |
| 6 | In$_{0.49}$Ga$_{0.51}$P | P | $1 \times 10^{18}$ | 0.01 | 0 |
| 7 | GaAs | P | $2 \times 10^{18}$ | 0.8 | 0 |
| 14 | In$_{0.49}$Ga$_{0.51}$P | P | $1 \times 10^{18}$ | 0.05 | 0 |
| 15 | GaAs | N | $1 \times 10^{18}$ | 0.8 | 0 |

The width of the mesa 20 is 5 $\mu$m. The length and width of the semiconductor body 10 and the length of the mesa 20 are approximately 500 $\mu$m. The conductive layers 8, 9 are of usual thickness and composition. The emission wavelength of the diode of this embodiment is 635 nm. The manufacture of the diode by a method according to the invention will be described below.

Figure 4:
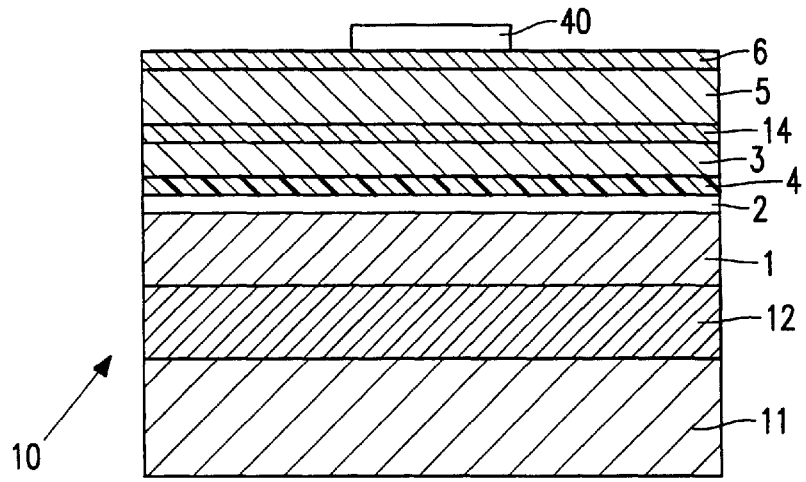

FIGS. 4 to 6 diagrammatically show the diode of FIG. 1 in consecutive stages of its manufacture by a method according to the invention. In a first growing process (see FIG. 4), the layers 12, 1, 2, 4, 3, 14, 5 and 6 are provided in that order on a substrate 11. MOVPE (=Metal Organic Vapor Phase Epitaxy) is used for this. The materials, compositions, and thicknesses according to the invention are chosen for these layers, see the Table above. More in particular, a barrier layer 4 of AlP is provided according to the invention between the active layer 2 and the second cladding layer 3. A strip-shaped mask 40 of SiO$_2$ is provided on the resulting semiconductor layer structure. After this (see FIG. 5), the mesa 20 is formed through etching of the semiconductor layer structure on either side of the mask 40 down to the etching stopper layer 4. In a second (MOVPE) deposition process (see FIG. 6), the current-blocking layer 15 is now provided on either side of the mesa 20, resulting in a substantially planar structure. After removal of the SiO$_2$ mask, finally, the contact layer 7 is provided over the structure in a third (MOVPE) growing process. The diodes are ready for use after metalization on both sides 8, 9 and cleaving in two directions.

FIG. 7 shows the external efficiency ($\eta_{ext}$) of a large number of diodes comparable to the diode of FIG. 1, without an AlP barrier layer 4 (open symbols) and with an AlP barrier layer 4 (closed symbols). The relative difference in lattice constant of the further barrier layer 2B ($\Delta a/a$) compared with the substrate 11 was the variable parameter here. The average efficiency of diodes without a barrier layer 4 is indicated with the line 71 and is 0.47. The average efficiency of diodes with a 2.5 nm thick barrier layer 4 of AlP is indicated with the line 72 and is 0.62. This means that a diode according to the invention has a 1.32 (=0.62/0.42) times greater effiency than a diode without an AlP barrier layer 4, which clearly demonstrates the major importance of the invention.

The invention is not limited to the examples given since many modifications and variations are possible to those skilled in the art within the scope of the invention. Thus semiconductor materials or compositions thereof may be used other than those mentioned in the example. The substrate may alternatively be made of silicon. It is also possible for the active layer to comprise a number of quantum well layers other than two. The emission wavelength of a diode according to the invention may vary between between 600 nm and 700 nm at room temperature. The conductivity types may also be all (simultaneously) be replaced by their opposites. The diode may be of a type other than the BR type, such as the BH (=Buried Hetero) type or the RW (=Ridge Waveguide) type. Alternative epitaxial deposition techniques may be used besides or instead of MOVPE.

We claim:

1. A radiation-emitting semiconductor diode with a semiconductor body comprising a substrate of a first conductivity type and made of GaAs and with a semiconductor layer structure situated thereon and comprising at least a first cladding layer of the first conductivity type and made of InAlGaP or InAlP, a second cladding layer of a second conductivity type opposed to the first and also made of InAlGaP or InAlP, and between the first and second cladding layers an active layer of InAlGaP or InGaP and a pn junction which, given a sufficient current strength in the forward direction, is capable of generating electromagnetic radiation through recombination of charge carriers in a strip-shaped active region forming part of the active layer, the first cladding layer and the second cladding layer being connected to connection conductors, while a barrier for the charge carriers is present between the active layer and the first or second cladding layer, which barrier has a greater bandgap than the first or second cladding layer, characterized in that the barrier is formed by only a single barrier layer comprising AlP and having a thickness which is approximately equal to 2.5 nm.

2. A radiation-emitting semiconductor diode as claimed in claim 1, characterized in that a barrier in the form of a single barrier layer is present exclusively between the active layer 2 and that cladding layer which is of the p-conductivity type.

3. A radiation-emitting semiconductor diode as claimed in claim 1, characterized in that the barrier layer is present within a distance from the active layer equal to the diffusion length of the charge carrier.

4. A radiation-emitting semiconductor diode as claimed in claim 1, characterized in that the active layer has a multi quantum well structure of alternating quantum well layers of InGaP or InAlGaP and further barrier layers of InAlGaP.

5. A radiation-emitting semiconductor diode as claimed in claim 4, characterized in that the multi quantum well structure has a lattice constant different from the lattice constant of the substrate.

6. A radiation-emitting semiconductor diode as claimed in claim 1, characterized in that the radiation-emitting semiconductor diode is a semiconductor diode laser.

* * * * *